(12) United States Patent
Hedebouw

(10) Patent No.: US 10,212,531 B2
(45) Date of Patent: Feb. 19, 2019

(54) AUDIO PROCESSOR

(71) Applicant: NXP B.V., Eindhoven (NL)

(72) Inventor: Bram Hedebouw, Heverlee (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/920,656

(22) Filed: Mar. 14, 2018

(65) Prior Publication Data

US 2019/0007777 A1 Jan. 3, 2019

(30) Foreign Application Priority Data

Jun. 29, 2017 (EP) ..................................... 17178760

(51) Int. Cl.
| | |
|---|---|
| H04S 3/00 | (2006.01) |
| H04R 5/02 | (2006.01) |
| H03G 5/16 | (2006.01) |
| H04R 5/04 | (2006.01) |
| H04R 3/04 | (2006.01) |

(52) U.S. Cl.
CPC ............ *H04S 3/008* (2013.01); *H03G 5/165* (2013.01); *H04R 3/04* (2013.01); *H04R 5/02* (2013.01); *H04R 5/04* (2013.01); *H04R 2499/13* (2013.01)

(58) Field of Classification Search
CPC .......... H04S 3/008; H03G 5/165; H04R 3/04; H04R 5/02; H04R 5/04; H04R 2499/13
See application file for complete search history.

(56) References Cited

U.S. PATENT DOCUMENTS

| | | | | |
|---|---|---|---|---|
| 5,428,687 | A * | 6/1995 | Willcocks | H04S 5/005 381/18 |
| 5,912,976 | A * | 6/1999 | Klayman | H04S 3/002 381/1 |
| 7,286,676 | B2 * | 10/2007 | Kato | H04S 3/00 381/107 |
| 7,864,963 | B2 * | 1/2011 | Hagiwara | H04S 3/00 381/17 |
| 8,693,697 | B2 * | 4/2014 | Van Dongen | G10L 19/008 381/17 |
| 8,804,971 | B1 * | 8/2014 | Williams | G10L 19/008 381/17 |

(Continued)

FOREIGN PATENT DOCUMENTS

| | | |
|---|---|---|
| EP | 0782369 A2 | 7/1997 |
| EP | 0782369 A3 | 7/1997 |

(Continued)

OTHER PUBLICATIONS

Leach Jr., W. Marshall, "A generalized active equalizer for closed-box loudspeaker systems," Mar. 1990, J. Audio Eng. Soc., vol. 38, No. 3, pp. 142-146.

*Primary Examiner* — Mohammad K Islam (57) ABSTRACT

A method and apparatus of audio processing is described. An audio processor may receive a multi-channel audio signal. In a first mode of operation, an audio processor may output a first audio signal on a first multi-channel audio output and a second audio signal on a second multi-channel audio output. In a second mode of operation, the audio processor may output a third audio signal on the first multi-channel audio output and a sub-woofer audio signal on at least one channel of the second multi-channel output.

15 Claims, 4 Drawing Sheets

(56) References Cited

U.S. PATENT DOCUMENTS

| | | | |
|---|---|---|---|
| 9,042,558 B2* | 5/2015 | Takada | G10L 19/008 381/20 |
| 9,756,424 B2* | 9/2017 | Kallai | H04R 27/00 |
| 2002/0076065 A1 | 6/2002 | Yamamoto et al. | |
| 2003/0142830 A1* | 7/2003 | Rishoj | H04S 3/02 381/27 |
| 2007/0206814 A1* | 9/2007 | Beard | H04H 20/48 381/21 |
| 2011/0002470 A1* | 1/2011 | Purnhagen | G10L 19/008 381/23 |
| 2012/0121092 A1* | 5/2012 | Starobin | H04R 5/02 381/17 |
| 2014/0244106 A1 | 8/2014 | Singer et al. | |
| 2015/0245122 A1* | 8/2015 | Rayner | H04R 1/2834 381/152 |
| 2016/0057520 A1 | 2/2016 | Barksdale et al. | |
| 2016/0212565 A1 | 7/2016 | Barksdale et al. | |
| 2016/0330560 A1* | 11/2016 | Chon | H04S 5/005 |

FOREIGN PATENT DOCUMENTS

| | | |
|---|---|---|
| EP | 1003282 A2 | 5/2000 |
| EP | 1003282 A3 | 5/2006 |
| JP | 2002152900 | 5/2002 |
| WO | 2012172394 A1 | 12/2012 |
| WO | 2016028853 A1 | 2/2016 |

* cited by examiner

AUDIO PROCESSOR

CROSS-REFERENCE TO RELATED APPLICATIONS

This application claims priority under 35 U.S.C. § 119 to European Patent Application No. 17178760.9, filed on Jun. 29, 2017, the contents of which are incorporated by reference herein.

FIELD

This disclosure relates to an audio processor for a vehicle audio system.

BACKGROUND

Vehicle audio systems often have at least two pairs of speakers for stereo audio. In a car, one pair of speakers may typically be located in the front of the vehicle and another set of speakers may be located in the rear of the vehicle, typically mounted in a rear door or back shelf. The audio system may process an audio signal for the front set of speakers primarily for listening by the driver and passenger (s) sitting at the front of the vehicle. The audio system may separately process an audio signal for the rear set of speakers primarily for the passenger(s) sitting at the rear of the vehicle.

SUMMARY

Various aspects of the disclosure are defined in the accompanying claims. In a first aspect, there is defined an audio processor for a vehicle audio system, the audio processor comprising: a multi-channel audio input; a first multi-channel audio output; a second multi-channel audio output; wherein the audio processor is configured to receive a multi-channel audio signal on the multi-channel audio input, and in a first mode of operation to output a first audio signal on the first multi-channel audio output and a second audio signal on the second multi-channel audio output, and configured in a second mode of operation to output a third audio signal on the first multi-channel audio output and a sub-woofer audio signal on at least one channel of the second multi-channel audio output, wherein the first audio output signal, the second audio output signal, the third audio signal, and the subwoofer signal comprise at least one channel of the multi-channel audio signal.

In embodiments, the audio processor may comprise a high pass filter wherein in the second mode, the high-pass filter is coupled to the first multi-channel audio output and the audio processor is configured to high-pass filter each of the audio channels received on the multi-channel audio input and wherein the third audio output signal comprises at least one of the high pass filtered channel audio channels.

In embodiments, the audio processor may comprise a mixer having a mixer input coupled to the multi-channel audio input, a mixer output coupled to the first multi-channel audio output, wherein in the second mode the audio processor is configured to generate the third audio output signal by mixing at least two of the channels of the multi-channel audio signal In embodiments, the audio processor may comprise a mixer, and a low-pass filter, the mixer having a mixer input coupled to the multi-channel audio input, a mixer output coupled to the low pass filter input wherein in the second mode the low pass filter output is coupled to the second multi-channel audio output and wherein the audio processor is configured to generate the sub-woofer audio signal by mixing at least two of the channels of the multi-channel audio signal and low-pass filtering the mixed stereo signal.

In embodiments, the audio processor may comprise a first low pass filter, and a second low pass filter, the first low pass filter having an input coupled to a left audio channel of the multi-channel audio input, the second low pass filter having an input coupled to a right audio channel of the multi-channel audio input, wherein in the second mode of operation the first low pass filter output is coupled to a left channel of the second multi-channel audio output, the second low pass filter output is coupled to a right channel of the second multi-channel audio output and wherein the audio processor is configured to generate the sub-woofer signal by low-pass filtering a left channel audio signal and a right channel audio signal.

In embodiments, the audio processor may be configured to receive a sub-woofer audio signal on the multi-channel audio input and in the second mode of operation to output the sub-woofer audio signal on the second multi-channel audio output.

In embodiments, the audio processor may comprise a speaker processor having an input coupled to the multi-channel audio input, a first multi-channel output and a second multi-channel output, wherein the speaker processor is configured to generate the third audio signal and the sub-woofer signal by applying at least one of equalization and dynamic range compression and to the multi-channel audio signal. In embodiments, the audio processor may comprise a multiplexer and a further speaker processor having an input coupled to the multi-channel audio input, a first and second further speaker processor multi-channel output coupled to a respective multiplexer input, wherein the first and second speaker processor multi-channel outputs are coupled to a respective multiplexer input and wherein the multiplexer further comprises a first multiplexer multi-channel output coupled to the first audio multi-channel output, a second multiplexer multi-channel output coupled to the second audio multi-channel output, and a mode control input, and wherein in response to a mode control signal on the mode control input indicating the first mode of operation, the multiplexer is configured to route the further speaker processor first multi-channel output to the first audio multi-channel output and the further speaker processor second multi-channel output to the second audio multi-channel output, and in response to the mode control signal indicating the second mode of operation, the multiplexer is configured to route the speaker processor first multi-channel output to the first audio multi-channel output and the speaker processor second multi-channel output to the second audio multi-channel output.

In embodiments, the audio processor may be configured to adapt the effective frequency response of a set of loudspeakers operably connected to the second multi-channel audio output to a lower frequency in the second mode than the first mode.

Embodiments of the audio processor may be included in a vehicle audio system comprising a first set of loudspeakers coupled to the first multi-channel audio output and a second set of loudspeakers coupled to the second multi-channel audio output.

The vehicle audio system may comprise a car seat sensor input coupled to the audio processor wherein the audio processor is configured to switch between the first mode and the second mode in dependence of the car seat sensor input.

In a vehicle comprising the vehicle audio system the audio processor may be configured to switch between the first mode and the second mode dependent on whether the rear seats are occupied.

In a second aspect there is described a method of audio processing comprising: receiving a multi-channel audio signal; in a first mode of operation, outputting a first audio signal on a first multi-channel audio output and a second audio signal on a second multi-channel audio output; in a second mode of operation outputting a third audio signal on the first multi-channel audio output and a sub-woofer audio signal on at least one channel of the second multi-channel output, wherein the first audio output signal, second output audio signal, and third audio output signal comprise at least one channel of the multi-channel audio signal. In some examples the first audio output signal may be the same as the second and third audio output signals.

Embodiments of the audio processing method may comprise, in the second mode high pass filtering each of a left channel audio signal and a right channel audio signal received on a respective channel of the multi-channel audio input and outputting the high pass filtered left channel audio signal and right channel audio signal on a respective channel of the first multi-channel audio output.

Embodiments of the audio processing method may further comprise in the second mode generating the subwoofer signal by mixing a left channel audio signal with a right channel signal audio received on a respective channel of the multi-channel audio input and low pass filtering the mixed audio signal.

In a third aspect there is described a computer program product comprising instructions which, when being executed by a processing unit, cause said processing unit to perform the steps of receiving a multi-channel audio signal; in a first mode of operation, outputting a first audio signal on a first multi-channel audio output and a second audio signal on a second multi-channel audio output; in a second mode of operation outputting a third audio signal on the first multi-channel audio output and a sub-woofer audio signal on at least one channel of the second multi-channel output, wherein the first audio output signal, second output audio signal, and third audio output signal comprise at least one channel of the multi-channel audio signal.

In the figures and description like reference numerals refer to like features. Embodiments are now described in detail, by way of example only, illustrated by the accompanying drawings in which.

DESCRIPTION

Figure 1:
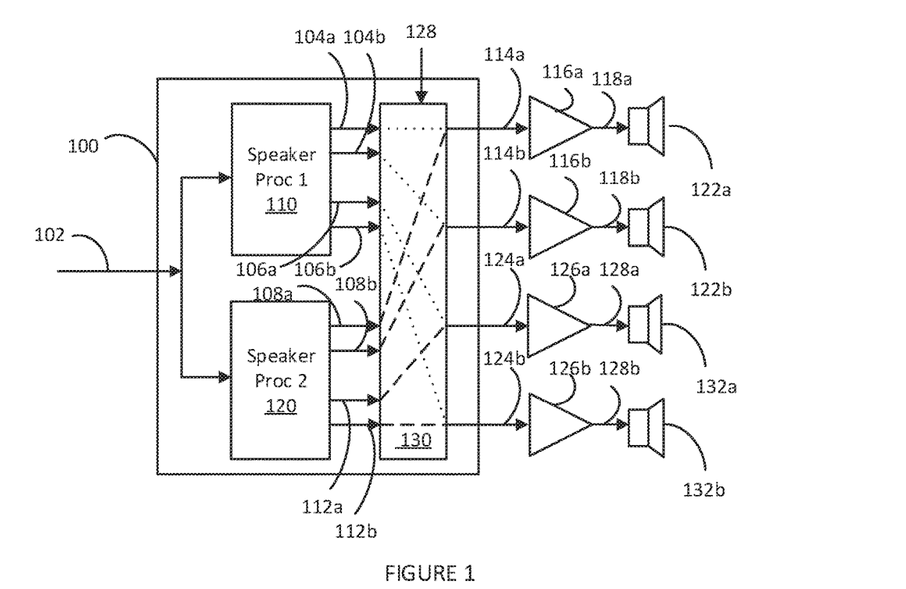
FIG. 1 Shows an audio processor according to an embodiment.

FIG. 1 shows an audio processor 100 including a first speaker processor 110, a second speaker processor 120 and a multiplexer 130. The audio processor 100 may have a multi-channel audio input 102. In some examples the multi-channel input may have two channels for receiving the two channels of a stereo audio signal which are conventionally denoted as a right channel and left channel. In other examples, the multi-channel input may receive more than two channels. For example, the multichannel input may receive two audio channels and a subwoofer channel. In other examples the multi-channel input may receive five channels and optionally a subwoofer channel for a surround sound system. The audio processor 100 may have a first multi-channel output having a first left channel 114a and a first right channel 114b. The audio processor 100 may have a second multi-channel output having a second left channel 124a and a second right channel 124b. The audio processor 100 may have a mode control input 128.

The audio input 102 may be connected to the first speaker processor 110. The audio input 102 may be connected to the second speaker processor 120.

The first speaker processor 110 may have a first multi-channel output having left channel output 104a and right channel output 104b connected to the multiplexer 130. The first speaker processor 110 may have a second multi-channel output having left channel output 106a and right channel output 106b connected to the multiplexer 130. In other examples the first speaker processor first multi-channel output and second multi-channel output may have more than two channels. In some examples the multi-channel audio input may have a different number of channels than the first and second multi-channel outputs. In some examples, the first and second multi-channel outputs may have different numbers of channels.

The second speaker processor 120 may have a first multi-channel output having left channel output 108a and right channel output 108b connected to the multiplexer 130. The second speaker processor 120 may have a second multi-channel output having left channel output 112a and right channel output 112b connected to the multiplexer 130. In other examples the second speaker processor first multi-channel output and second multi-channel output may have more than two channels.

The mode control input 128 may be connected to a control input of the multiplexer 130. The multiplexer 130 may have a have a first multi-channel output connected to the audio processor first left channel output 114a and audio processor first right channel output 114b. The multiplexer 130 may have a second multi-channel output connected to the audio processor first left channel output 124a and audio processor first right channel output 124b.

In operation, the audio processor first left channel output 114a and first right channel output 114b may be connected to an input of respective loudspeaker amplifiers 116a, 116b. The respective amplifier outputs 118a, 118b may be connected to loudspeakers 122a, 122b. The audio processor second left channel output 124a and second right channel output 124b may be connected to an input of respective loudspeaker amplifiers 126a, 126b. The respective amplifier outputs 128a, 128b may be connected to loudspeakers 132a, 132b. The mode of operation may be determined by a mode control signal on mode control input 128. The combination of the audio processor 100, loudspeaker amplifiers 116a, 116b, 126a, 126b, and loudspeakers 122a,122b,132a,132b may be included in a vehicle audio system. In other examples, the audio processor first and second multi-channel outputs may have additional channels, each additional output channel may be connected to a respective loudspeaker amplifier and loudspeaker. Each of the multi-channel outputs may be connected to a respective set of loudspeakers. Each set of loudspeakers may consist of two or more loudspeakers.

An audio signal may be received on the audio input 102. The audio signal may include a multi-channel audio signal, for example a stereo signal. The audio signal may be processed by a first speaker processor 110. The first speaker processor 110 may process the received audio signal for example by filtering or dynamic range compression. The first speaker processor 110 may output a first processed multi-channel signal on the first speaker processor first multi-channel output 104a, 104b. The first speaker processor 110 may output a second processed multi-channel signal on the first speaker processor second multi-channel output 106a, 106b.

The audio signal may be processed by the second speaker processor 120. The second speaker processor 120 may process the received audio signal for example by filtering or dynamic range compression. The second speaker processor 120 may output a processed multi-channel signal on the second speaker processor first multi-channel output 108a, 108b. The processed multi-channel signal may be high pass filtered. The second speaker processor 120 may output a sub-woofer audio signal on one or both second speaker processor audio outputs 112a, 112b. The sub-woofer signal may be generated by applying a low-pass filter to the audio signal. The sub-woofer signal may be a signal only containing audio frequencies below 100 Hz. In other examples the sub-woofer signal may only contain audio frequencies below 80 Hz.

In a first mode of operation of the audio processor 100, the multiplexer 130 may route a processed audio signal on the first multi-channel output 104a, 104b of the first speaker processor 110 to the first audio multi-channel output 114a, 114b. The multiplexer 130 may route a processed audio signal on the second multi-channel output 106a, 106b of the first speaker processor 110 to the second audio multi-channel output 114a, 114b.

In a second mode of operation of the audio processor 100, the multiplexer 130 may route a processed audio signal on the first multi-channel output 106a, 106b of the second speaker processor 110 to the first audio multi-channel output 114a, 114b. The multiplexer 130 may route a processed audio signal on the second output 112a, 112b of the second speaker processor 110 to the second audio multi-channel output 124a, 124b. In some examples, a processed audio signal may only be routed to one of the channels 124a, 124b of the second audio multi-channel output.

The audio processor 100 may be implemented in hardware/software or a combination of hardware and software. For example, the first and second speaker processors 110, 120 may be implemented as digital logic or software running on a digital signal processor. In some examples, the first and second speaker processors may be combined. In some examples the mode control signal may be coupled to the first and second processor and may enable the first speaker processor 110 in the first mode and the second speaker processor 120 in the second mode. In this case, the multiplexer 130 may be omitted. The multiplexer 130 may be implemented in hardware or software running on a digital signal processor.

In car audio systems having two sets of speakers where one set of speakers is located in the front of the car cabin and a second set of speaker is located in the rear of the car cabin, when both front and back seats are occupied, the audio processor 100 may operate in the first mode, which is a typical operation mode for a car audio system. When only the front seats are occupied, the audio processor 100 may operate in the second mode. Switching between the first and second mode may be done by a user of the vehicle audio system including audio processor 100. In other examples, the mode input 128 may be connected to a seat pressure sensor (not shown) which may automatically detect when the rear seats are unoccupied and so automatically switch between modes.

The inventors of the present disclosure have appreciated that in vehicle audio systems with for example front and rear sets of speakers, the rear speakers may be used as a subwoofer system for reproducing the low frequency content when the rear seats are unoccupied. Using the rear speakers as a sub-woofer may create better sound quality without the need for a dedicated sub-woofer speaker. This way, possible distortions and/or artefacts created from processing to prevent distortions caused by the low frequencies, for example loudspeaker protection using a dynamic range compressor, do not interact anymore with the higher frequency band played back through the front speakers. Removing the high frequencies from the rear speaker or speakers configured as a sub-woofer may also create extra headroom for the rear speakers to improve the reproduction of the lower frequency bands. The lower frequency bands may include frequencies below 100 Hz. As a secondary effect, higher frequency artefacts/harmonics caused by these lower frequencies are less audible because they are only present at the rear speakers which are off-direction compared to a front listener.

Figure 2:
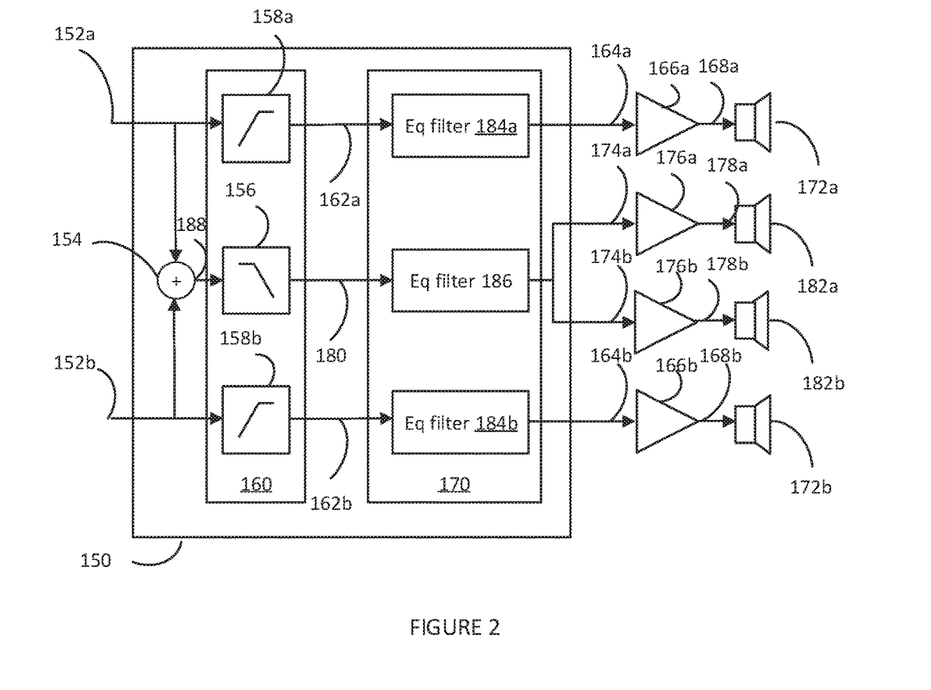
FIG. 2 Illustrates an audio processor according to an embodiment.

FIG. 2 shows an audio processor 150 configured in the second mode of operation. Audio processor 150 includes an audio mixer 154, a cross-over filter network 160 and speaker processor 170. The cross-over filter network 160 may include a left channel high pass filter 158a, a right channel high pass filter 158b and a low pass filter 156. Audio processor 150 has a multi-channel audio input including a left channel 152a and a right channel 152b. Audio processor 150 has a first multi-channel output including a first left channel 164a and a first right channel 164b. Audio processor 150 has a second multi-channel output including a second left channel 174a and a second right channel 174b.

The left audio input channel 152a and the right audio input channel 152b may be connected to inputs of the mixer 154. The left audio input channel 152a and the right audio input channel 152b may be connected to the input of respective high pass filters 158a and 158b. The mixer output 188 may be connected to the input of the low pass filter 156. The speaker processor 170 may include a left channel equalization filter 184a, a right channel equalization filter 184b, and a subwoofer equalization filter 186. The left channel high pass filter output 162a may be connected to an input of the left channel equalization filter 184a. The right channel high pass filter output 162b may be connected to an input of the right channel equalization filter 184b. The low pass filter output 180 may be connected to the input of the subwoofer equalization filter 186.

The output of the left channel equalization filter 184a may be connected to the audio processor first left channel output 164a. The output of the right channel equalization filter 184b may be connected to the audio processor first right channel output 164b. The output of the subwoofer equalization filter 186 may be connected to the audio processor second left channel output 174a. The output of the subwoofer equalization filter 186 may be connected to the audio processor second right channel output 174b.

In operation, the audio processor first left channel output 164a and first right channel output 164b may be connected to an input of respective loudspeaker amplifiers 166a, 166b. The respective amplifier outputs 168a, 168b may be connected to a first pair of loudspeakers 172a, 172b. The audio processor second left channel output 174a and second right channel output 174b may be connected to an input of respective loudspeaker amplifiers 176a, 176b. The respective amplifier outputs 178a, 178b may be connected to a second pair of loudspeakers 182a, 182b.

In a first mode of operation the speaker processor 170 may be disabled by a mode control input (not shown). The audio inputs left and right channels 152a, 152b may be connected to the respective first and second left and right channels 164a, 174a, 164b, 174b via a further speaker processor (not shown) which conventionally processes the audio signal for output by the respective first pair of speakers 172a, 172b and second pair of speakers 182a, 182b.

In a second mode of operation, the further speaker processor may be disabled and the speaker processor 170 may be enabled. A multi-channel audio input signal may be received, split into left and right channels respectively and sent to the cross-over filter network 160.

The high-pass filters 158a, 158b may remove the lower frequency part of the audio signal for output via the first set of speakers 172a, 172b. The low frequency part may include frequencies below 100 Hz. In a car or other motor vehicle, the first set of speakers 172a, 172b may be located at the front of the cabin. The low-pass filter 156 may remove the higher frequencies from the mono signal produced from the multi-channel input. The higher frequencies may be frequencies above 100 Hz. The inventors of the present disclosure have appreciated that lower frequencies, for example below 100 Hz are non-directional so by converting the input multi-channel to a mono audio signal, only a single low pass filter is required. The mono audio signal may be output to one or both of the second set of speakers 182a, 182b. In a car or other motor vehicle, the second set of speakers 182a, 182b may be located at the rear of the cabin.

The speaker processor 170 equalization filters 184a, 184b may adapt the respective high-pass filtered signal so that a target transfer function for a combination of the equalization filters 184a, 184b the first set of speakers 172a, 172b is obtained resulting in a more balanced acoustical response. The equalization may be applied to frequencies within a range of 100 Hz to 20 KHz. The sub-woofer equalization filter 186 may adapt the low pass filtered signal so that a target transfer function for a combination of the sub-woofer equalization filter 186 and each of the second set of speakers 182a, 182b is obtained, for example having a lower resonance frequency. In this way, the second set of speakers 182a, 182b may be adapted to be used as a sub-woofer system in the second mode of operation, by decreasing the effective resonant frequency of the second set of speakers 182a, 182b. A typical loudspeaker resonance frequency for a car may be in the range of 50 Hz and 120 Hz. By lowering the effective resonance frequency, the speaker may reproduce frequencies down to 20 Hz, which may be below the physical resonance frequency of the loudspeaker. In some examples one or more of the equalization filters 184a, 184b and the sub-woofer equalization filter 186 may be omitted. In other examples the cross-over filter network 160 may be combined with the loudspeaker processor 170.

By filtering the higher frequencies from the second set of speakers 182a, 182b, more headroom may become available to reproduce the lower frequencies which may improve the total low frequency reproduction. In addition, the first set of speakers 172a, 172b may no longer have to reproduce lower frequencies which creates extra headroom and less interference due to lower frequencies distortions on the higher frequencies. The inventors of the present disclosure have further appreciated that distortions caused by low frequency over-excursion and possible loud- speaker protection artefacts will mostly affect the second set of speakers 182a, 182b. By filtering the lower frequencies before the audio signal is transmitted to the first set of speakers 172a, 172b, the first set of speakers may be protected from damage caused by too high membrane excursions. In addition, high membrane excursions may generate audible distortions at higher sound pressure levels.

For an audio system including first set of speakers 172a, 172b located in the front of a motor vehicle cabin, and a second set of speakers 182a, 182b located in the rear of a motor vehicle cabin, because these low frequency distortions or artefacts appear as higher frequency harmonics of the base frequency, the artefacts may be less audible for a listener sitting at the front because of the directional properties of higher frequencies played back by a rear speaker.

Figure 3:
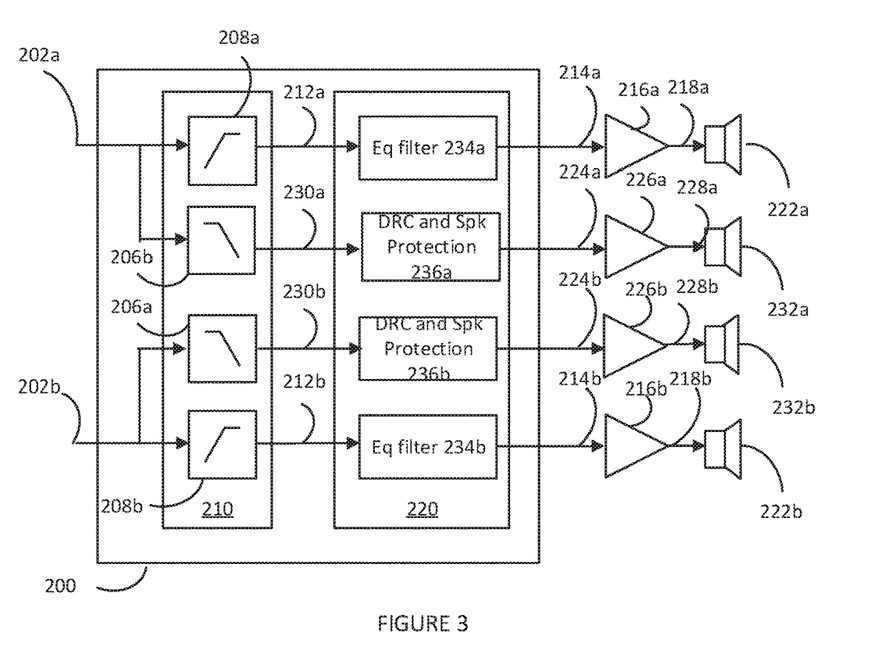
FIG. 3 Shows an audio processor according to an embodiment.

FIG. 3 shows an audio processor 200 configured in the second mode of operation. Audio processor 200 includes a cross-over filter network 210 and speaker processor 220. The cross-over filter network 210 may include a left channel high pass filter 208a, a right channel high pass filter 208b, a left channel low pass filter 206a, and a right channel low pass filter 206b. The audio processor 200 has a multi-channel audio input including a left channel 202a and a right channel 202b. Audio processor 200 has a first multi-channel output including a first left channel 214a and a first right channel 214b. Audio processor 200 has a second multi-channel output including a second left channel 224a and a second right channel 224b.

The left audio input channel 202a and the right audio input channel 202b may be connected to the input of respective high pass filters 208a and 208b. The left audio input channel 202a and the right audio input channel 202b may be connected to the input of respective low pass filters 206a and 206b.

The speaker processor 220 may include a left channel equalization filter 234a, a right channel equalization filter 234b, a left channel dynamic range compression (DRC) module 236a, and a right channel DRC module 236b. The left channel high pass filter output 212a may be connected to an input of the left channel equalization filter 234a. The right channel high pass filter output 212b may be connected to an input of the right channel equalization filter 234b.

The left channel low pass filter output 230a may be connected to the input of the left channel DRC 236a. The right channel low pass filter output 230b may be connected to the input of the right channel DRC 236b.

The output of the left channel equalization filter 234a may be connected to the audio processor first left channel output 214a. The output of the right channel equalization filter 234b may be connected to the audio processor first right channel output 214b. The output of the left channel DRC 236a may be connected to the audio processor second left channel output 224a. The output of the right channel DRC 236b may be connected to the audio processor second right channel output 224b.

In operation, the audio processor first left channel output 214a and first right channel output 214b may be connected to an input of respective loudspeaker amplifiers 216a, 216b. The respective amplifier outputs 218a, 218b may be connected to a first pair of loudspeakers 222a, 222b. The audio processor second left channel output 224a and second right channel output 224b may be connected to an input of respective loudspeaker amplifiers 226a, 226b. The respective amplifier outputs 228a, 228b may be connected to a second pair of loudspeakers 232a, 232b.

In a first mode of operation the speaker processor 220 may be disabled. The left and right channels 202a, 202b of the audio input may be connected to the respective first and second left and right channels 214a, 224a, 214b, 224b via a further speaker processor (not shown) which conventionally processes the audio signal for output by the respective first pair of speakers 222a, 222b and second pair of speakers 232a, 232b.

In a second mode of operation, the further speaker processor may be disabled and the speaker processor 220 may be enabled. A multi-channel audio input signal may be received, split into left and right channels respectively and sent to the cross-over filter network 210. The high-pass filters 208a, 208b may remove the lower frequency part of the audio signal for output via the first set of speakers 222a, 222b. The low frequency part may include frequencies below 100 Hz. In a car or other motor vehicle, the first set of speakers 222a, 222b may be located at the front of the cabin. The low-pass filters 206a, 206b may remove the higher frequencies from the respective left and right channels of the audio signal. The higher frequencies may be frequencies above 100 Hz. The left and right channel low pass filtered signal which may be considered to be a sub-woofer audio signal may be output to the second set of speakers 232a, 232b. In a car or other motor vehicle, the second set of speakers 232a, 232b may be located at the rear of the cabin.

The speaker processor equalization filters 234a, 234b may adapt the respective high-pass filtered signal to match the acoustic response of the first set of loudspeakers 222a, 222b. The left and right channel DRC 236a, 236b may adapt the low pass filtered signal to extend the frequency response of the second set of speakers 232a, 232b to lower frequencies. In this way, the second set of speakers 232a, 232b may be adapted to be used as a sub-woofer system in the second mode of operation. In addition, the left and right channel DRC 236a, 236b may apply a speaker protection algorithm to the low pass filtered signals which may allow the full dynamic range of the second set of speakers 232a, 232b to be to be used as a sub-woofer.

Figure 4:
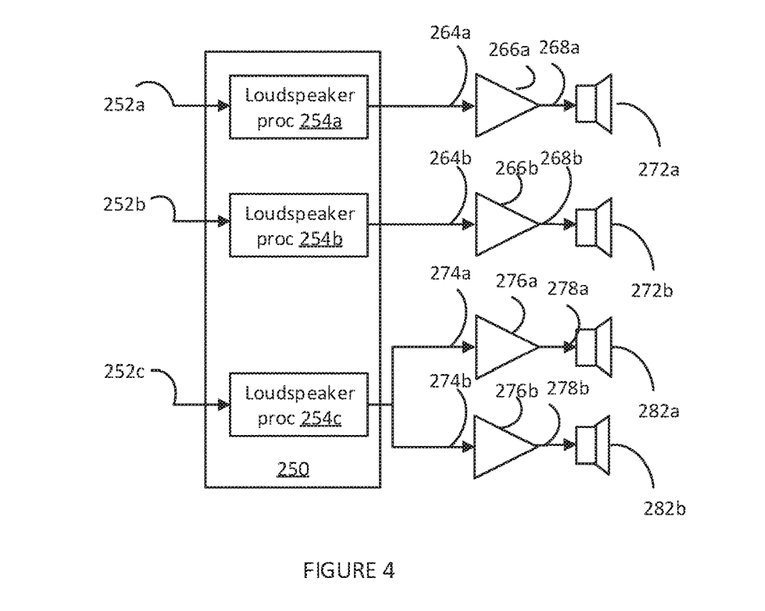
FIG. 4 illustrates an audio processor according to an embodiment.

FIG. 4 shows an audio processor 250 with a separate sub-woofer channel configured in the second mode of operation. Some vehicle audio systems may include a subwoofer channel available. In addition, audio content, such as Dolby Digital, contains a pre-mixed low-frequency effect (LFE) channel that may be used as a subwoofer channel.

Audio processor 250 includes a left channel speaker processor module 254a, a right channel speaker processor module 254b and a subwoofer channel speaker processor module 254c. Audio processor 250 has a multi-channel audio input including a left channel input 252a, a right channel input 252b and a sub-woofer channel input 252c. The left channel input 252a may be connected to the left channel speaker processor module 254a. The right channel input 252b may be connected to the right channel speaker processor module 254b. The sub-woofer channel input 252c may be connected to the sub-woofer channel speaker processor module 254c.

The output of the left channel speaker processor module 254a may be connected to the audio processor first left channel output 264a. The output of the right channel speaker processor module 254b may be connected to the audio processor first right channel output 264b. The output of the sub-woofer channel speaker processor module 254c may be connected to the audio processor second left channel output 274a. The output of the sub-woofer channel speaker processor module 254c may be connected to the audio processor second right channel output 274b.

In operation, the audio processor first left channel output 264a and first right channel output 264b may be connected to an input of respective loudspeaker amplifiers 266a, 266b. The respective amplifier outputs 268a, 268b may be connected to a first pair of loudspeakers 272a, 272b. The audio processor second left channel output 274a and second right channel output 274b may be connected to an input of respective loudspeaker amplifiers 276a, 276b. The respective amplifier outputs 278a, 278b may be connected to a second pair of loudspeakers 282a, 282b.

In a first mode of operation the speaker processors 254a, 254b, 254c may be disabled. The audio inputs left and right channels 252a, 252b may be connected to the respective first and second left and right channels 264a, 274a, 264b, 274b via a further speaker processor (not shown) which conventionally processes the audio signal for output by the respective first pair of speakers 272a, 272b and second pair of speakers 282a, 282b.

In a second mode of operation, the further speaker processor may be disabled and the speaker processors 254a, 254b, 254c may be enabled. An audio input signal may be received including left, right and sub-woofer channels on respective inputs 252a, 252b and 252c. Loudspeaker processors 254a, 254b may apply a high pass filter to the audio signal for output via the first set of speakers 272a, 272b. Sub-woofer speaker processor 254c may apply equalization to the received sub-woofer signal. The equalized sub-woofer audio signal may be output to the second set of speakers 282a, 282b. In a car or other motor vehicle, the second set of speakers 282a, 282b may be located at the rear of the cabin.

In vehicle audio systems with for example front and rear sets of speakers, the rear speakers may be used as a subwoofer system for reproducing the low frequency content, which may create better sound quality without the need for a dedicated sub-woofer speaker. This way, possible distortions and/or artefacts created from processing to prevent distortions caused by the low frequencies (e.g. loudspeaker protection using dynamic range compressor) do not interact anymore with the higher frequency band played back through the front speakers. It will be appreciated that in some example audio systems included in autonomous vehicles, the front set of speakers may be configured as a sub-woofer if only the rear seats are occupied.

Figure 5:
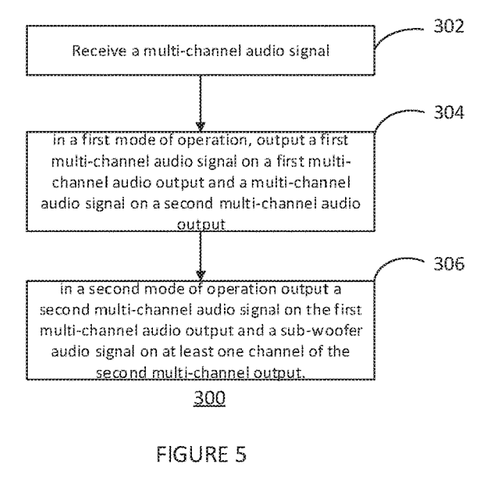
FIG. 5 shows a method of audio processing for a vehicle audio system according to an embodiment.

FIG. 5 shows a method of audio processing 300 for a vehicle audio system. In step 302 a multi-channel audio signal may be received. In step 304 in a first mode of operation, a first multi-channel audio signal may be transmitted on a first multi-channel audio output and a second multi-channel audio signal may be transmitted on a second multi-channel audio output. In step 306 in a second mode of operation a further processed multi-channel audio signal may be output on the first multi-channel audio output and a sub-woofer audio signal may be output on the second multi-channel output.

Figure 6:
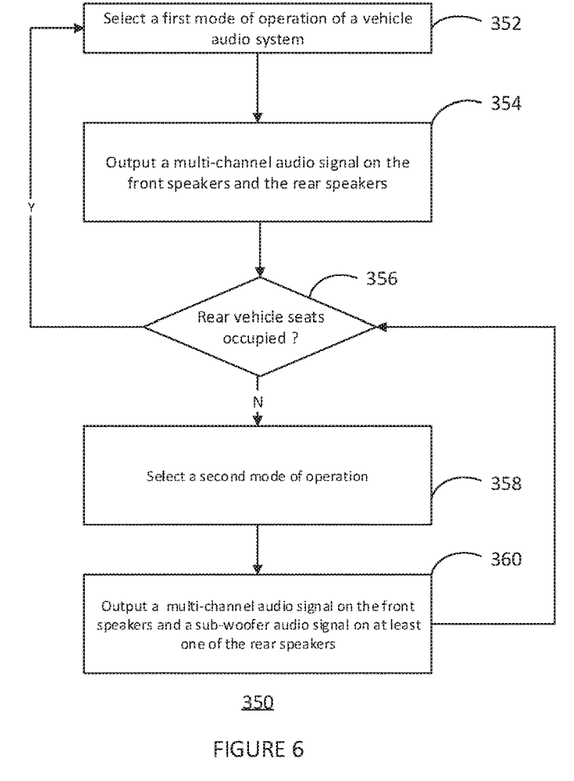
FIG. 6 illustrates a method of audio processing in a vehicle audio system with two pairs of loudspeakers according to an embodiment.

FIG. 6 show a method of audio processing 350 in a vehicle audio system including a front set of speakers and a rear set of speakers. In step 352 a first mode of operation is selected of the vehicle audio system. In step 354 a multi-channel audio signal may be output on the front speakers and the rear speakers. In step 356 a check is made on whether the rear seats of the vehicle are occupied. If the rear seats are occupied, the method returns to step 352. If the rear seats are not occupied, a second mode of operation is selected in step 358. The method then proceeds to step 360 in which a multi-channel audio signal is output on the front speakers, and a sub-woofer audio signal is output on at least one of the rear speakers. After step 360, the method then returns to step 356.

Figure 7:
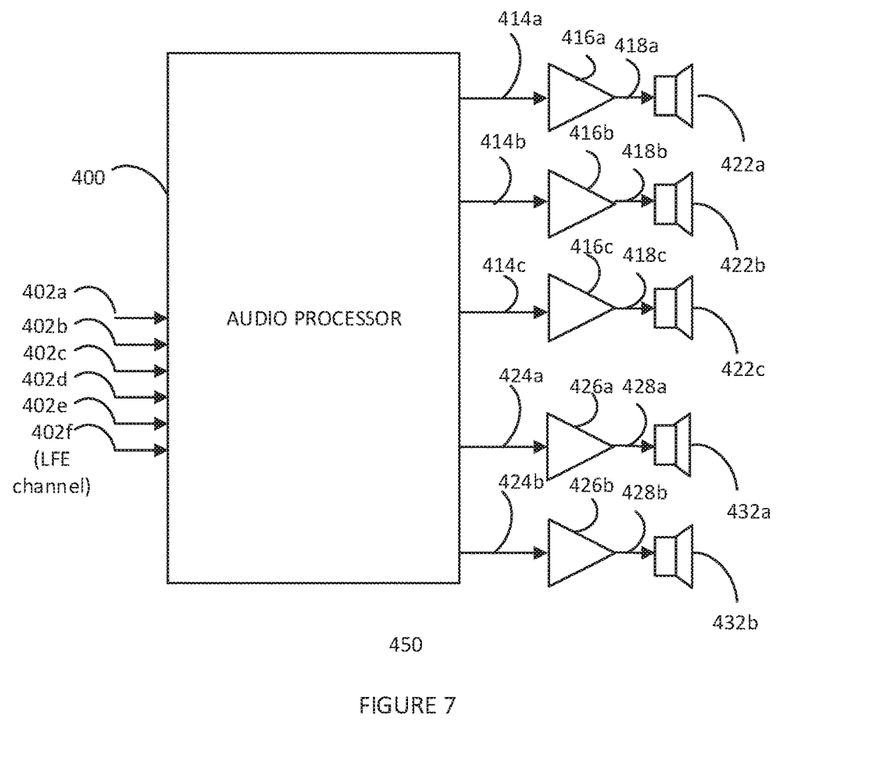
FIG. 7 illustrates an audio processor according to an embodiment.

FIG. 7 shows an example vehicle audio system 450. The vehicle audio system 450 may include an audio processor 400, speaker drivers 416a-c, 426a, 426b and speakers 422a-c, 432a, 432b. The audio processor 400 may have a multi-channel audio input which may include channels 402a-402f. The audio processor may have a first multi-channel audio output 414a-c, and second multi-channel audio output 424a, 424b. Each channel of the first multi-channel output 414a-c may be connected to an input of a respective speaker driver 416a-c. The respective output 419a-c of each speaker driver 416a-c may be connected to a respective loudspeaker 422a-c. The loudspeakers 422a-c may be referred to as a first set of speakers.

Each channel of the second multi-channel output 424a, 424b may be connected to an input of a respective speaker driver 426a, 426b. Each channel of the second multi-channel output 424a, 424b may be connected to an input of a respective speaker driver 416a-c. The respective output 428a, 428b of each speaker driver 426a, 426b may be connected to a respective loudspeaker 432a, 432b. The loudspeakers 432a, 432b may be referred to as a second set of speakers.

In some examples, the first and second multi-channel audio outputs may be combined into a single multi-channel audio output.

The vehicle audio system 450 when installed in a motor vehicle may have different modes of operation dependent on where passengers are in the vehicle. In a first mode of operation, a multichannel audio input may be received on respective channel 402a-e of the multichannel input. Optionally a LFE signal may be received on channel 402f. Each input channel 402a-c may be routed to a respective output channel 414a-c of the first multi-channel output by the audio processor 400. Channel 402d may be routed to channel 424a of the second multi-channel audio output by the audio processor 400. Channel 402e may be routed to channel 424b of the second multi-channel audio output by the audio processor 400.

The first set of speakers 422a-c may be configured as front-left, centre, and front-right speakers respectively. The second set of speakers 432a-b may be configured as rear-left and rear-right speakers.

In this first mode, the vehicle audio system may be configured to output multi-channel surround sound on the five speakers 422a-c, 432a-b. Alternatively, if only a stereo audio input is available, for example on channels 402a and 402b, the audio processor 400 may route input 402a to output channels 414a and 424a, input 402b to output channels 414c and 424b and a downmix of 402a and 402b on output channel 414b.

In the second mode of operation, the processor 400 may generate a further audio signal from the multi-channel audio input which is output on the first set of speakers 422a-c. The further audio signal may include one or more of the channels of the multichannel audio input. The processor 400 may generate a subwoofer signal for output on either or both of the second set of speakers 424a, 424b. The subwoofer signal may be generated by the audio processor 400 by a low-pass filtered mono downmix of the input channels 402a-402e. In some examples, the subwoofer signal may be generated by the audio processor 400 by routing the LFE channel input 402f to one or more of audio output channel 424a and 424b.

The subwoofer signal may be generated by the audio processor 400 by a low-pass filtered stereo downmix of the input channels 402a-402e.

The subwoofer signal may be generated by the audio processor 400 by a mix of a low-pass filtered stereo downmix of the input channels 402a-402e together with the LFE signal received on input channel 402f. For example, the left stereo input channels for example input channels 402a, 402d may be downmixed and low pass filtered and output on audio output channel 424a. The right stereo input channels for example input channels 402c, 402e may be downmixed and low pass filtered and output on audio output channel 424b.

A method and apparatus of audio processing is described. An audio processor may receive a multi-channel audio signal. In a first mode of operation, an audio processor may output a first audio signal on a first multi-channel audio output and a second audio signal on a second multi-channel audio output. In a second mode of operation, the audio processor may output a third audio signal on the first multi-channel audio output and a sub-woofer audio signal on at least one channel of the second multi-channel output. The first, second and third audio output signals and the sub-woofer signals may include one or more of the audio channels.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness, it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. An audio processor for a vehicle audio system, the audio processor comprising:
a multi-channel audio input;
a first multi-channel audio output;
a second multi-channel audio output;
wherein the audio processor is configured to
receive a multi-channel audio signal on the multi-channel audio input, and
in a first mode of operation to output a first audio output signal on the first multi-channel audio output, a second audio output signal on the second multi-channel audio output, and configured in a second mode of operation to output a third audio output signal on the first multi-channel audio output and a sub-woofer audio signal on at least one channel of the second multi-channel audio output wherein the first audio output signal, the second audio output signal, the third audio signal, and the subwoofer signal comprise at least one channel of the multi-channel audio signal.

2. The audio processor of claim 1 further comprising a high pass filter wherein in the second mode, the high-pass filter is coupled to the first multi-channel audio output and the audio processor is configured to high-pass filter each of the audio channels received on the multi-channel audio input and wherein the third audio output signal comprises at least one of the high pass filtered audio channels.

3. The audio processor of claim 1 further comprising a mixer having a mixer input coupled to the multi-channel audio input, a mixer output coupled to the first multi-channel audio output, wherein in the second mode the audio processor is configured to generate the third audio output signal by mixing at least two of the channels of the multi-channel audio signal.

4. The audio processor of claim 1 further comprising a mixer, and a low-pass filter, the mixer having a mixer input coupled to the multi-channel audio input, a mixer output coupled to the low pass filter input wherein in the second mode the low pass filter output is coupled to the second multi-channel audio output and wherein the audio processor is configured to generate the sub-woofer audio signal by mixing at least two of the channels of the multi-channel audio signal and low-pass filtering the mixed multi-channel signal.

5. The audio processor of claim 1 further comprising a first low pass filter, and a second low pass filter, the first low pass filter having an input coupled to a left audio channel of the multi-channel audio input, the second low pass filter having an input coupled to a right audio channel of the multi-channel audio input, wherein in the second mode of operation the first low pass filter output is coupled to a left channel of the second multi-channel audio output, the second low pass filter output is coupled to a right channel of the second multi-channel audio output and wherein the audio processor is configured to generate the sub-woofer signal by low-pass filtering a left channel audio signal and a right channel audio signal.

6. The audio processor of claims 1 wherein the audio processor is configured to receive a sub-woofer audio signal on the multi-channel audio input and in the second mode of operation to output the sub-woofer audio signal on the second multi-channel audio output.

7. The audio processor of claim 1 further comprising a speaker processor having an input coupled to the multi-channel audio input, a first multi-channel output and a second multi-channel output, wherein the speaker processor is configured to generate the third audio signal and the sub-woofer signal by applying at least one of equalization and dynamic range compression to the multi-channel audio signal.

8. The audio processor of claim 7 further comprising a multiplexer and a further speaker processor having an input coupled to the multi-channel audio input, a first and second further speaker processor multi-channel output coupled to a respective multiplexer input, wherein the first and second speaker processor multi-channel outputs are coupled to a respective multiplexer input and wherein the multiplexer further comprises a first multiplexer multi-channel output coupled to the first audio multi-channel output, a second multiplexer multi-channel output coupled to the second audio multi-channel output, and a mode control input, and wherein in response to a mode control signal on the mode control input indicating the first mode of operation, the multiplexer is configured to route the further speaker processor first multi-channel output to the first audio multi-channel output and the further speaker processor second multi-channel output to the second audio multi-channel output, and in response to the mode control signal indicating the second mode of operation, the multiplexer is configured to route the speaker processor first multi-channel output to the first audio multi-channel output and the speaker processor second multi-channel output to the second audio multi-channel output.

9. The audio processor of claim 7 wherein the audio processor is configured to adapt the effective frequency response of a set of loudspeakers operably connected to the second multi-channel audio output to a lower frequency in the second mode than the first mode.

10. A vehicle audio system comprising the audio processor of claim 1 and further comprising a first set of loudspeakers coupled to the first multi-channel audio output and a second set of loudspeakers coupled to the second multi-channel audio output.

11. The vehicle audio system of claim 10 further comprising a car seat sensor input coupled to the audio processor wherein the audio processor is configured to switch between the first mode and the second mode in dependence of the car seat sensor input.

12. A vehicle comprising the vehicle audio system of claim 11 wherein the audio processor is configured to switch between the first mode and the second mode dependent on whether the rear seats are occupied.

13. A method of audio processing comprising:
receiving a multi-channel audio signal;
in a first mode of operation, outputting a first audio output signal on a first multi-channel audio output and a second audio output signal on a second multi-channel audio output;
in a second mode of operation outputting a third audio output signal on the first multi-channel audio output and a sub-woofer audio signal on at least one channel of the second multi-channel output, wherein the first audio output signal, second output audio signal, and third audio output signal comprise at least one channel of the multi-channel audio signal.

14. The method of claim 11 further comprising in the second mode high pass filtering each of a left channel audio signal and a right channel audio signal received on a respective channel of the multi-channel audio input and outputting the high pass filtered left channel audio signal and right channel audio signal on a respective channel of the first multi-channel audio output.

15. The method of claim 11 further comprising in the second mode generating the subwoofer signal by mixing a left channel audio signal with a right channel signal audio received on a respective channel of the multi-channel audio input and low pass filtering the mixed audio signal.

* * * * *